US011538664B2

(12) United States Patent
Asano et al.

(10) Patent No.: US 11,538,664 B2
(45) Date of Patent: Dec. 27, 2022

(54) PLASMA TREATMENT APPARATUS AND METHOD

(71) Applicant: JCU CORPORATION, Tokyo (JP)

(72) Inventors: Keisuke Asano, Tokyo (JP); Kenichi Yamada, Tokyo (JP); Tomohiro Kawasaki, Tokyo (JP); Nobutaka Numagawa, Tokyo (JP)

(73) Assignee: JCU CORPORATION, Tokyo (JP)

( * ) Notice: Subject to any disclaimer, the term of this patent is extended or adjusted under 35 U.S.C. 154(b) by 166 days.

(21) Appl. No.: 16/203,294

(22) Filed: Nov. 28, 2018

(65) Prior Publication Data

US 2019/0096637 A1 Mar. 28, 2019

Related U.S. Application Data

(63) Continuation of application No. PCT/JP2016/065935, filed on May 30, 2016.

(51) Int. Cl.
*H01J 37/32* (2006.01)
*H01L 21/67* (2006.01)
(Continued)

(52) U.S. Cl.
CPC ........ *H01J 37/32449* (2013.01); *H01J 37/18* (2013.01); *H01J 37/32568* (2013.01);
(Continued)

(58) Field of Classification Search
CPC ................. H01J 37/32449; H01J 37/18; H01J 37/32568; H01J 37/32577;
(Continued)

(56) References Cited

U.S. PATENT DOCUMENTS

2002/0129902 A1* 9/2002 Babayan ............... C23C 16/402
156/345.45
2003/0168172 A1* 9/2003 Glukhoy ........... H01J 37/32082
156/345.28
(Continued)

FOREIGN PATENT DOCUMENTS

JP H 08-037178 A 2/1996
JP 2008-053728 A 3/2008
(Continued)

OTHER PUBLICATIONS

English Machine Translation of JP2011096749 Tanaka et al. retrieved from JPLAT Dec. 3, 2019 (Year: 2019).*

(Continued)

*Primary Examiner* — Ram N Kackar
*Assistant Examiner* — Laureen Chan
(74) *Attorney, Agent, or Firm* — McGinn I.P. Law Group, PLLC.

(57) ABSTRACT

A substrate is held in a substrate holder and accommodated in a treatment chamber. A positive electrode panel is arranged opposite to a surface of the substrate. Process gas is sent from a blower panel, toward the positive electrode panel and the substrate. A positive electrode of a high-frequency power source is connected to the positive electrode panel, and a negative electrode of the high-frequency power source is connected to the blower panel, to apply a high-frequency voltage. The process gas passes between the positive electrode panel and the blower panel which is the negative electrode, so that plasma is generated. The generated plasma removes contaminants on the surface of the substrate.

18 Claims, 8 Drawing Sheets

(51) Int. Cl.
*H01J 37/18* (2006.01)
*H01L 21/311* (2006.01)

(52) U.S. Cl.
CPC .. *H01J 37/32577* (2013.01); *H01J 37/32715* (2013.01); *H01J 37/32834* (2013.01); *H01L 21/67109* (2013.01); *H01L 21/67248* (2013.01); *H01J 2237/3355* (2013.01); *H01L 21/31138* (2013.01)

(58) Field of Classification Search
CPC .......... H01J 37/32715; H01J 37/32834; H01J 2237/3355; H01J 37/32541; H01J 37/32091; H01J 37/3244–32449; H01J 3/32522; H01L 21/67248; H01L 21/67109; H01L 21/31138; H01L 21/02046; H01L 21/67034; H01L 21/67069; H05H 2001/4675
See application file for complete search history.

(56) References Cited

U.S. PATENT DOCUMENTS

| | | | | |
|---|---|---|---|---|
| 2004/0129211 | A1* | 7/2004 | Blonigan | C23C 16/45591 118/715 |
| 2005/0238818 | A1* | 10/2005 | Yoshizawa | H01J 37/32082 427/569 |
| 2008/0047580 | A1 | 2/2008 | Kim et al. | |
| 2008/0138992 | A1* | 6/2008 | DiVergilio | H05H 1/46 438/710 |
| 2008/0178807 | A1* | 7/2008 | Wang | C23F 4/00 118/723 R |
| 2009/0000743 | A1* | 1/2009 | Iizuka | H01J 37/32091 156/345.34 |
| 2010/0006543 | A1* | 1/2010 | Sawada | H01J 37/32091 216/67 |
| 2011/0293854 | A1* | 12/2011 | Takizawa | H01L 22/12 427/569 |
| 2015/0228461 | A1* | 8/2015 | Fukazawa | H01J 37/32091 216/71 |
| 2016/0115595 | A1* | 4/2016 | Hwang | C23C 16/45565 239/548 |
| 2017/0096738 | A1* | 4/2017 | Kurita | C23C 16/45565 |

FOREIGN PATENT DOCUMENTS

| | | | |
|---|---|---|---|
| JP | 2008-172168 A | | 7/2008 |
| JP | 2008-186994 A | | 8/2008 |
| JP | 2011096749 A | * | 5/2011 |
| WO | WO 2014/064779 A1 | | 5/2014 |
| WO | WO-2014064779 A1 | * | 5/2014 ........ H01J 37/32091 |

OTHER PUBLICATIONS

Translation of Written Opinion of the International Search Authority (WOSA) (PCT Form PCT/ISA/237), in PCT/JP2016/065935, dated Jul. 26, 2016.

Korean Office Action, dated Sep. 25, 2019, in Korean Application No. 10-2018-7026044 and English Translation thereof.

International Search Report (ISR) (PCT Form PCT/ISA/210), in PCT/JP2016/065935, dated Jul. 26, 2016, and English Translation thereof.

Written Opinion of the International Search Authority (WOSA) (PCT Form PCT/ISA/237), in PCT/JP2016/065935, dated Jul. 26, 2016.

Japanese Office Action, dated Jan. 28, 2020, in Japanese Application No. 2018-520219 and English Translation thereof.

* cited by examiner

PLASMA TREATMENT APPARATUS AND METHOD

CROSS-REFERENCE TO RELATED APPLICATIONS

This application is a Continuation of PCT International Application No. PCT/JP2016/065935 filed on 30 May 2016. The above application is hereby expressly incorporated by reference, in its entirety, into the present application.

BACKGROUND OF THE INVENTION

1. Field of the Invention

The present invention relates to a plasma treatment apparatus and method for subjecting a workpiece to plasma treatment in a treatment chamber in a vacuum state.

2. Description of the Related Art

A plasma treatment apparatus for subjecting a workpiece such as a substrate to various kinds of treatment using plasma in a treatment chamber in a vacuum state is known. As the plasma treatment, there are, for example, cleaning for removing contaminated substances adhered to a surface of the substrate, etching, desmearing for removing resin residues (i.e. smears) adhered to a wall surface of a through-hole formed in the substrate, descumming for removing residues (i.e. scum) of resist (e.g. organic substances) adhered to the surface of the substrate, and the like. In the plasma treatment, the inside of the treatment chamber is brought into a vacuum state, and in a state that high-frequency voltage is applied between a pair of electrodes from a high-frequency power source, process gas is introduced into the treatment chamber. Thereby, the process gas is made into plasma. Then, radicals and ions contained in the generated plasma come in contact with or collide with the surface of the workpiece, and thereby the contaminated substances adhered to the surface of the workpiece are removed, namely, the surface of the workpiece is cleaned.

In an ashing apparatus disclosed in JP1996(H08)-037178A, a substrate as a workpiece is disposed between a pair of flat-plate electrodes in a treatment chamber and subjected to ashing treatment in which resist is ashed and removed by plasma. One of the pair of flat-plate electrodes is applied with high-frequency voltage, and the other of the pair of flat-plate electrodes is grounded. In a state that the substrate is mounted on the grounded electrode, process gas is introduced into the treatment chamber, and plasma is generated, so as to subject the substrate to the treatment.

In addition, in a plasma cleaning apparatus described in JP2008-186994A, a pair of electrodes are arranged so as to sandwich a substrate as a workpiece, and process gas is introduced from one electrode side to the other electrode side to clean the substrate with plasma.

Since the above examples of the plasma treatment apparatus adopt the configuration in which the substrate as the workpiece is disposed between the pair of electrodes, the substrate is disposed in plasma. In this case, since the amount of plasma applied to the surface of the substrate becomes too much, the substrate tends to be damaged easily. Further, it is not easy to adjust the amount and the distribution of the plasma on the surface of the substrate, and it is difficult to uniformly subject the surface of the substrate to the treatment.

SUMMARY OF THE INVENTION

In view of the foregoing, an object of the present invention is to provide a plasma treatment apparatus and method capable of supplying a workpiece with a sufficient amount of plasma and facilitating adjustment of an amount of plasma to be supplied at the time of subjecting the workpiece to the plasma treatment.

To achieve the above and other objects of the present invention, a plasma treatment apparatus of the present includes a workpiece holding member, a vacuum tank, a blower panel, and a positive electrode panel. The workpiece holding member holds a workpiece. The vacuum tank contains the workpiece holding member, and an interior of the vacuum tank is to be evacuated. The blower panel is to be a negative electrode, has a plurality of blower holes for sending process gas toward the workpiece held by the workpiece holding member, and is formed in a plate-like shape. The positive electrode panel is disposed between the blower panel and the workpiece holding member, and is constituted by arranging a plurality of rod-like electrodes.

It is preferable that the workpiece has a plate shape, and a surface of the blower panel to be the negative electrode, the positive electrode panel, and the workpiece held in the workpiece holding member are arranged in parallel. It is preferable that the blower holes open toward between the rod-like electrodes of the electrode panel and are arranged in a matrix. It is preferable that the blower panel includes an air regulating plate inside, and the air regulating plate has a plurality of air regulating holes. Note that the term "parallel" also includes substantially parallel with one inclined by ±15° with respect to the other.

It is preferable that the vacuum tank is moved between a separated state in which a first tank and a second tank are separated and a connected state in which the first tank and the second tank are combined to enable evacuating, and in a case where the vacuum tank is in the separated state, the workpiece is carried in and out of the workpiece holding member.

It is preferable that the first tank has the workpiece holding member and an exhaust port of the process gas, the second tank has the blower panel and the electrode panel, and at least one of the first tank and the second tank has an air release hole.

It is preferable that the workpiece holding member holds the workpiece with both sides of the workpiece exposed, the blower panel and the electrode panel are provided on both sides from the workpiece across the workpiece, and plasma treatment is performed on the both sides of the workpiece.

It is preferable that the first tank and the second tank have the blower panel and the electrode panel, and the first tank or the second tank has the workpiece holding member, an exhaust port of the process gas, and an air release hole. It is preferable that the blower panel, the electrode panel and the workpiece holding member have a passage in which the heating medium is circulated.

A plasma treatment method includes steps of holding a plate-like workpiece and applying plasma treatment to the workpiece. In the step of holding the workpiece, the workpiece is held with a workpiece holding member in a vacuum tank. In the step of applying the plasma treatment to the workpiece, a high-frequency voltage is applied between a positive electrode panel arranged in parallel with the workpiece and a negative electrode panel arranged away from the positive electrode panel, on the side opposite to the workpiece arrangement side with respect to the positive electrode panel, and process gas is blown out from a plurality of blower holes arranged in the negative electrode panel toward the workpiece.

A plasma treatment method includes steps of holding a plate-like workpiece and applying plasma treatment to the both sides of the workpiece. In the step of holding the workpiece, the workpiece is held with a workpiece holding member in a vacuum tank with both sides of the workpiece exposed. In the step of applying the plasma treatment to the workpiece, a high-frequency voltage is applied between a positive electrode panel arranged in parallel with the both sides of the workpiece and a negative electrode panel arranged away from the positive electrode panel, on the side opposite to the workpiece arrangement side with respect to the positive electrode panel, and process gas is blown out from a plurality of blower holes arranged in the negative electrode panel toward the both sides of the workpiece.

According to the present invention, it is possible to supply the workpiece with plasma uniformly and sufficiently, and perform the treatment uniformly in a short time. In addition, it becomes possible to readily adjust the amount of plasma to be supplied to the workpiece. Furthermore, it is possible to complete the plasma treatment in a short time and prevent damage to the workpiece caused by heat.

DESCRIPTION OF THE PREFERRED EMBODIMENTS

First Embodiment

Figure 1:
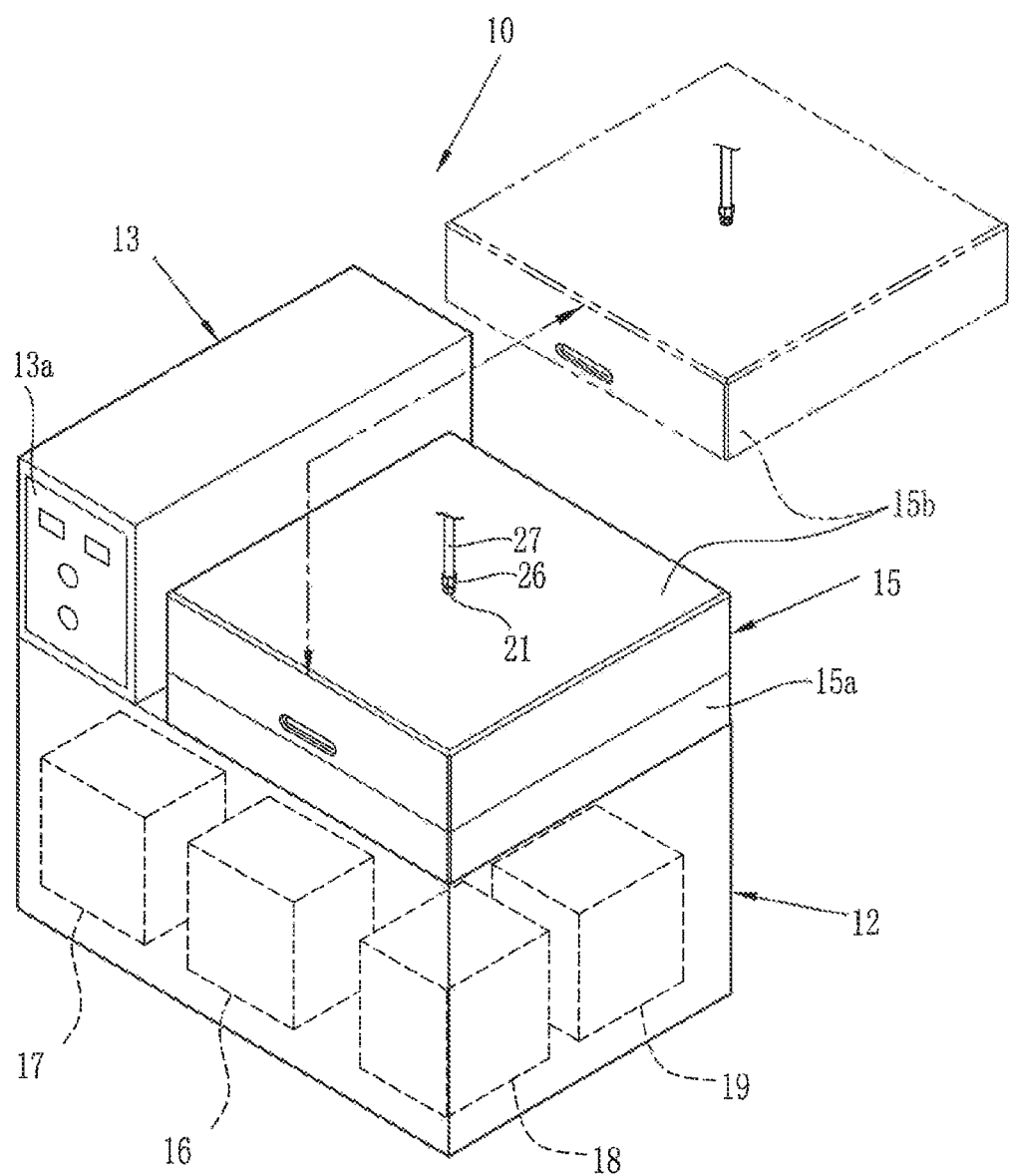
FIG. 1 is a perspective view illustrating an external appearance of a plasma treatment apparatus of the present invention.

As shown in FIG. 1, a plasma treatment apparatus 10 of the present invention subjects a workpiece to plasma treatment. In this example, a surface of a substrate 11 (see FIG. 3) which is a plate-like workpiece is a surface to be treated, and subjected to plasma treatment.

The plasma treatment apparatus 10 includes a treatment unit 12 and a control unit 13. The treatment unit 12 consists of a vacuum tank 15 in which a treatment chamber 14 (see FIG. 2) is formed, a vacuum pump 16, a gas feeder 17, a high-frequency power source 18, and a temperature controller 19. The control unit 13 has a circuit (not shown) for controlling the treatment unit 12, and an operation panel 13a.

Figure 3:
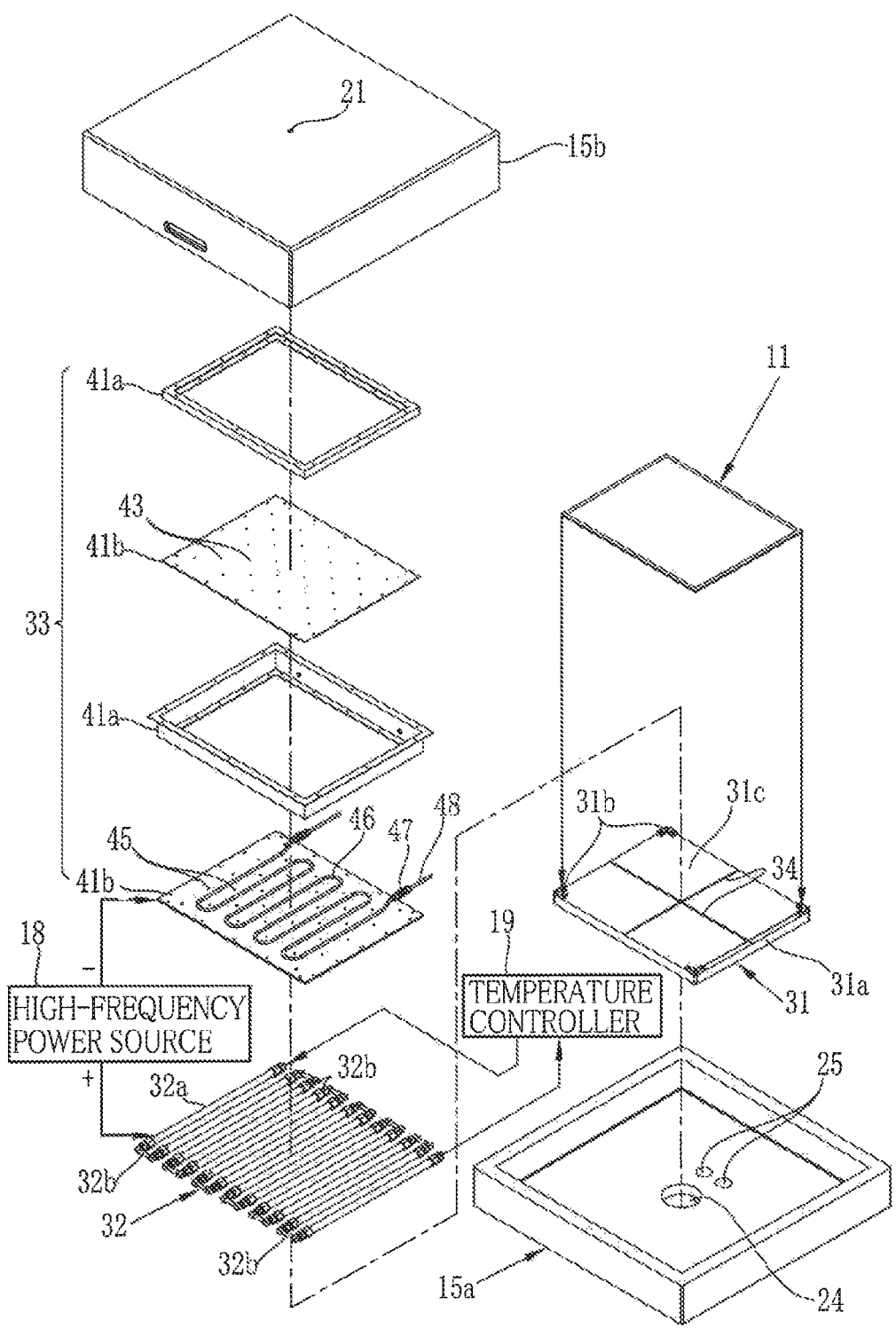
FIG. 3 is a perspective view showing the vacuum tank in exploded form.

The vacuum pump 16 exhausts air from the treatment chamber 14. For this purpose, as shown in FIG. 3, a vacuum tank main body 15a is provided with an evacuation hole (not shown) at the bottom. The vacuum pump 16 is connected to the evacuation hole via a pipe (not shown). By the operation of the vacuum pump 16, a degree of vacuum in the treatment chamber 14 falls within the range of 10 Pa to 30 Pa, for example. Further, the vacuum pump 16 continuously exhausts air from the treatment chamber 14 during the plasma treatment, such that a predetermined degree of vacuum is kept in the treatment chamber 14.

Figure 2:
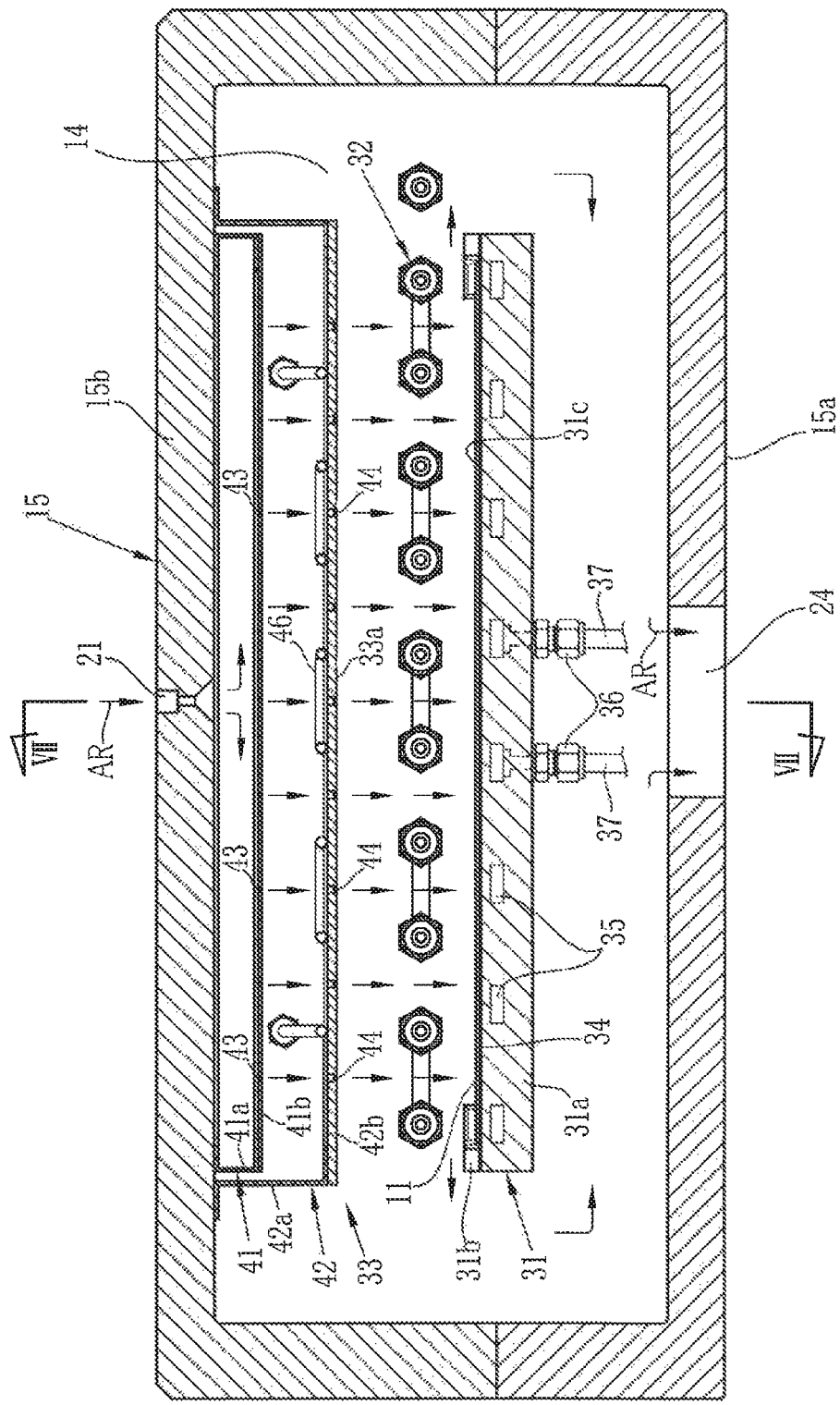
FIG. 2 is a longitudinal sectional view showing a vacuum tank constituting a treatment chamber.

As shown in FIG. 2, the vacuum tank 15 has a box shape and is made of stainless, for example. The vacuum tank 15 consists of the vacuum tank main body 15a as the first tank, and a lid (the second tank) 15b provided on an upper face of the vacuum tank main body 15a. As shown in FIG. 1, the lid 15b moves (shifts) between a closed position (connected state) shown by solid lines and an opened position (separated state) shown by chain double-dashed lines. As shown in FIG. 2, since the treatment chamber 14 is brought into an airtight state in the closed position, evacuation is enabled and the plasma treatment is executed. As shown in FIG. 1, since the lid 15b moves upward from the vacuum tank main body 15a and then for example horizontally moves to the back side to the opened position, the upper part of the vacuum tank main body 15a is opened. In the opened position, the substrate 11 can be carried into and carried out of the treatment chamber 14, and position adjustment and maintenance of a positive electrode panel 32 (see FIG. 2) becomes possible.

At the center of the upper surface of the lid 15b, a process gas introduction port 21 is provided. A gas feeder 17 is connected to the process gas introduction port 21 via a connector 26 and a tube 27, and process gas is introduced into the vacuum tank 15. Arrow lines AR in FIG. 2 and FIGS. 7 and 8 to be described later indicate the flow of the process gas.

The gas feeder 17 supplies process gas to be introduced into the treatment chamber 14. The process gas is mixed gas of carbon tetrafluoride ($CF_4$) and oxygen ($O_2$), for example. Note that the process gas is arbitrarily selected in accordance with the content of the plasma treatment, the workpiece, and the like. A single gas such as nitrogen gas, oxygen gas, hydrogen gas, and argon gas, or a mixed gas thereof is preferably used.

As shown in FIG. 3, on the bottom of the vacuum tank main body 15a, in addition to the evacuation hole (not shown), there provided are an exhaust port 24 of the process gas which is also serving as an air release hole, and a tube insertion hole 25. The exhaust port 24 of the process gas is provided with an air release valve (not shown). Since the air release valve is opened before opening the lid 15b, the air is released to atmosphere, and the process gas is exhausted from the exhaust port 24 of the process gas. Note that the exhaust port 24 of the process gas may be provided in the lid 15b. In the tube insertion hole 25, a tube 37 to be described later is inserted.

As shown in FIG. 2, the treatment chamber 14 contains, in order from the bottom to the top, a substrate holder 31 as the workpiece holding member, the positive electrode panel 32, and a blower panel 33 also serving as a negative electrode. The substrate holder 31 is horizontally attached to the vacuum tank main body 15a by using a bracket, a stay or the like which is not shown.

As shown in FIG. 3, the substrate holder 31 is loaded with the substrate 11 as the workpiece by a robot hand (not shown) or another transfer device. As shown in FIG. 2, a substrate mounting surface 31c of the substrate holder 31 is located above the opening surface of the vacuum tank main body 15a. Accordingly, the vacuum tank main body 15a does not become an obstacle to loading and unloading the substrate 11. Therefore, it is easy to load and unload the substrate 11 without complicating the passage route of the substrate 11. Note that the substrate mounting surface 31c may be located below the opening surface of the vacuum tank main body 15a.

Figure 4:
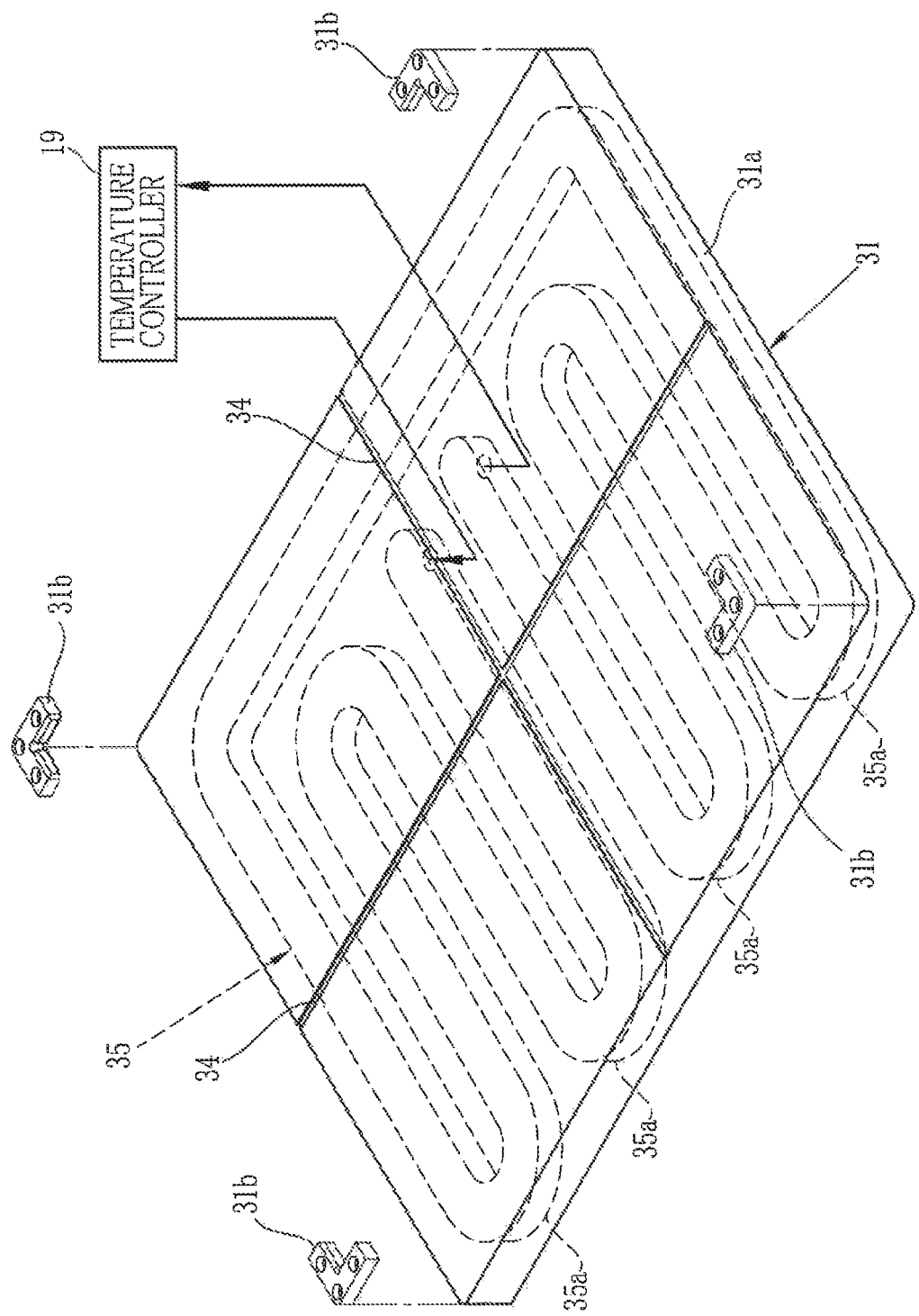
FIG. 4 is a perspective view showing a substrate holder in exploded form.

As shown in FIG. 4, the substrate holder 31 has a plate-like holder body 31a and guide frames 31b. The guide frames 31b are formed in an L shape and attached to the upper surface of the outer peripheral edge portion at the four corners of the holder body 31a. The guide frames 31b hold the four corners of the substrate 11 (see FIG. 2) and prevent it from falling out of the holder body 31a. Note that instead of or in addition to the guide frame 31b, a clamp device may be provided. The clamp device clamps the outer peripheral edge of the substrate.

On the substrate mounting surface 31c of the holder body 31a, grooves 34 are formed, for example, in a cross shape. The grooves 34 serve as a gas vent between the substrate 11 and the substrate mounting surface 31c during loading/unloading of the substrate 11 into/from the holder body 31a. By the degassing, it is possible to reliably and stably perform the setting and removal of the substrate 11.

In the interior of the substrate holder 31, a cooling passage 35 is formed substantially over the entire surface of the substrate mounting surface 31c. The cooling passage 35 is formed by connecting U-shaped passages 35a together. As shown in FIG. 2, the tube 37 is connected to the cooling passage 35 via a connector 36. The tube 37 is connected to the temperature controller 19 (see FIG. 1). The temperature controller 19 send cooling water as the heating medium from the outside of the vacuum tank 15 to the cooling passage 35 via the tube 37. Thereby, the substrate holder 31 is cooled and the substrate 11 is also cooled by the cooling of the substrate holder 31.

As shown in FIG. 2, the positive electrode panel 32 and the blower panel 33 are installed inside the lid 15b. The blower panel 33 is arranged on the inner upper surface of the lid 15b. The blower panel 33 has a double structure of an inner panel 41 and an outer panel 42 covering the inner panel 41.

Figure 5:
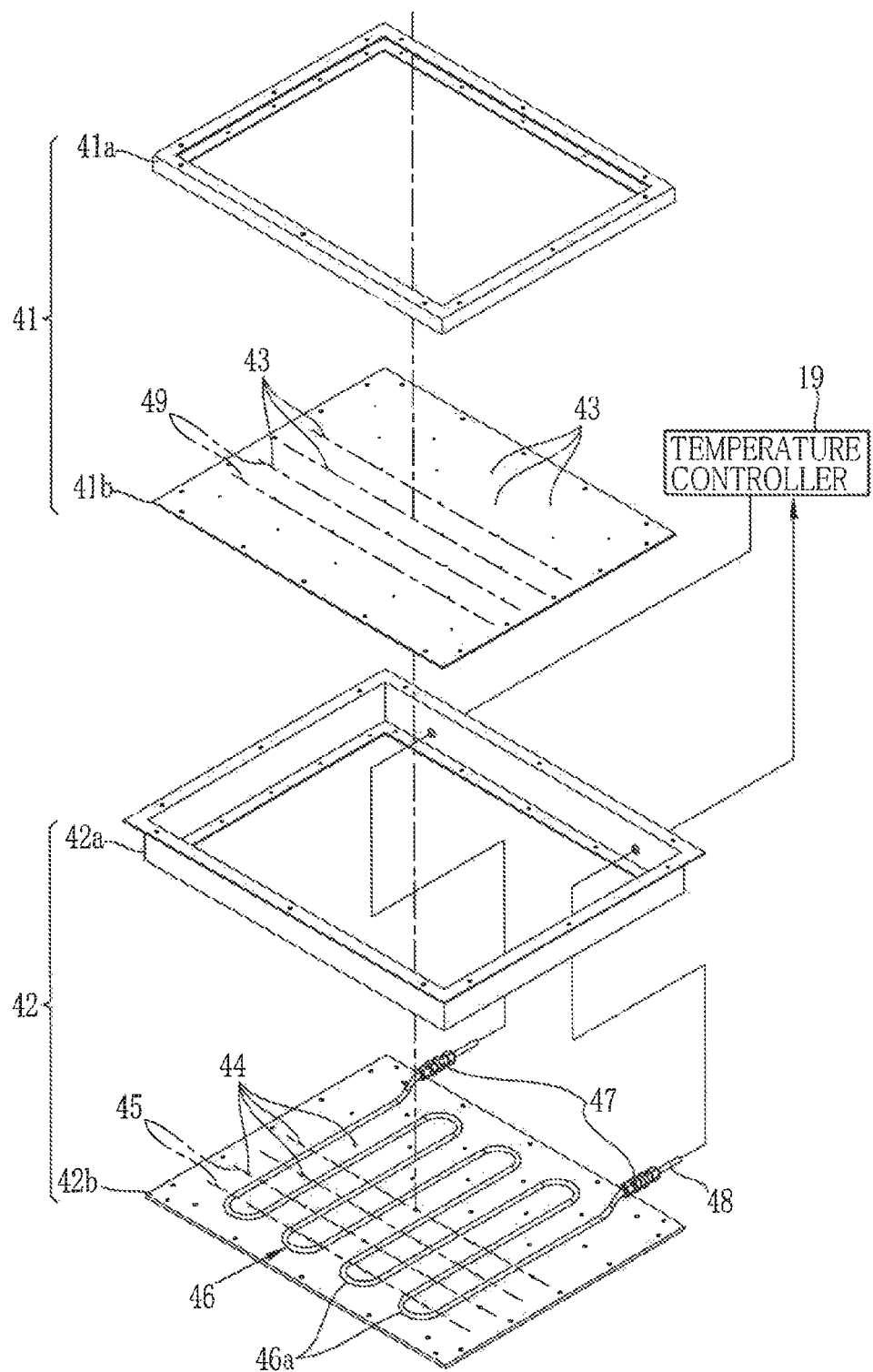
FIG. 5 is a perspective view showing a blower panel in exploded form.

As shown in FIG. 5, the inner panel 41 is formed in a rectangular thin box shape. The inner panel 41 has a rectangular frame 41a and an air regulating plate 41b covering the frame 41a. A plurality of air regulating holes 43 are arranged on the air regulating plate 41b.

Like the inner panel 41, the outer panel 42 is also formed in a rectangular thin box shape. The outer panel 42 has a rectangular frame 42a and a nozzle plate 42b covering the frame 42a. A plurality of blower holes 44 are arranged on the nozzle plate 42b.

The blower holes 44 are arranged such that blower holes rows 45 are arranged with intervals in a direction orthogonal to the blower holes row 45. In the blower holes row 45, the blower holes 44 are arranged at a pitch of, for example, 50 mm. The blower holes rows 45 adjacent to each other are arranged such that the formation positions of the blower holes 44 are shifted by, for example, 25 mm which is half the pitch. Accordingly, the blower holes 44 of one of the blower holes rows 45 are located in the middle of the blower holes 44 of the other blower holes row 45. As well as the blower holes 44, the air regulating holes 43 constitute air regulating holes rows 49.

The air regulating holes 43 and the blower holes 44 are, for example, circular holes with a diameter of 1 mm, and a pitch of the holes 43 and 44 is 50 mm. Note that it is preferable to appropriately change the diameter and pitch of these holes 43, 44 according to the size of the substrate 11 to be processed, the capacity of the treatment chamber 14, and so on. Note that when viewing the nozzle plate 42b rotated by 45°, the air regulating holes 43 and the blower holes 44 are arranged in a matrix.

On the inside of the outer panel 42, a cooling pipe 46 is arranged in close contact with the nozzle plate 42b. Like the cooling passage 35, the cooling pipe 46 is also constructed by connecting, for example, four U-shaped pipes 46a and arranging them in a plane. The cooling pipe 46 is arranged between the blower holes 44 so as not to block the blower holes 44.

A tube 48 is connected to both ends of the cooling pipe 46 via connectors 47. The tube 48 is connected to the temperature controller 19. The temperature controller 19 send cooling water as the heating medium from outside of the vacuum tank 15 to the cooling pipe 46 via the tube 48. Thereby, the blower panel 33 is cooled.

As shown in FIG. 2, the positive electrode panel 32 is arranged parallel to a blower surface 33a of the blower panel 33, away from the blower surface 33a. Therefore, the blower surface 33a which is the surface of the blower panel 33 which becomes the negative electrode, the positive electrode panel 32, and the substrate 11 held in the substrate holder 31 are arranged in parallel. In other words, the blower panel 33 is arranged away from the positive electrode panel 32, on the side opposite to the substrate arrangement side with respect to the positive electrode panel 32.

Figure 6:
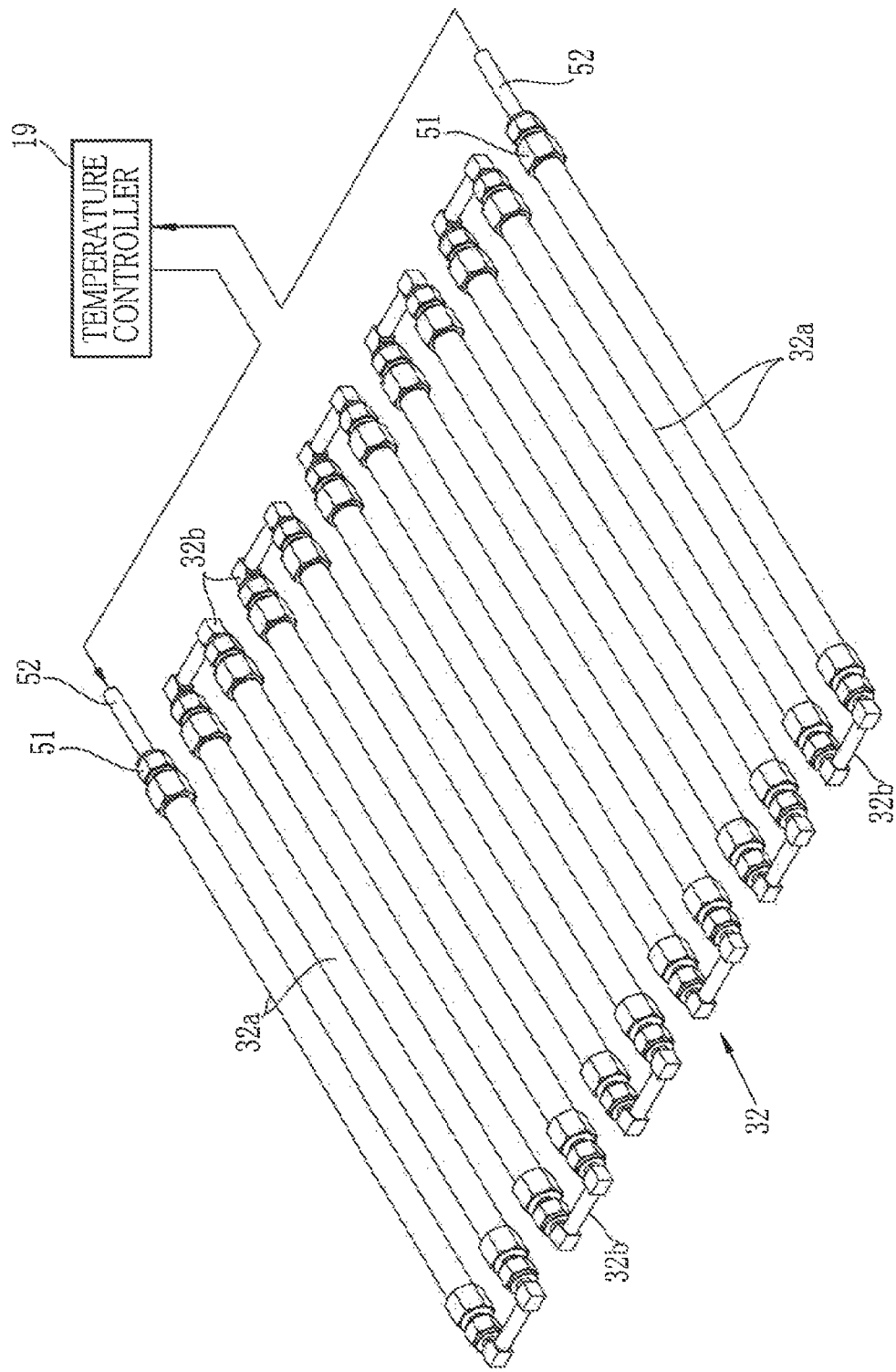
FIG. 6 is a perspective view of an electrode panel.

As shown in FIG. 6, the positive electrode panel 32 is constituted, for example, by arranging rod-like electrodes 32a in a plane, in which each of the rod-like electrode 32a is formed of an aluminum pipe. The distance between the blower surface 33a and the center line of the rod-like electrode 32a of the electrode panel 32 is, for example, 50 mm. In addition, the distance between the center line of the rod-like electrode 32a of the electrode panel 32 and the substrate 11 is, for example, 25 mm which is half the distance between the blower surface 33a and the center line of the rod-like electrode 32a.

One end of the rod-like electrode 32a is connected to one end of the adjacent rod-like electrode 32a via a coupler 32b and the other end of the rod-like electrode 32a is connected to the other end of the other adjacent rod-like electrode 32a. Through these connections, a plurality of the rod-like electrodes 32a are connected in series. Accordingly, like the cooling pipe 46, the electrode panel 32 is formed by arranging the adjacent rod-like electrodes 32a in a U shape and connecting a plurality of the U-shaped electrodes in a plane. The arrangement pitch of the rod-like electrodes 32a is 50 mm, which is the same as the pitch of the blower holes 44 of the nozzle plate 42b. When viewed from the direction of the centerline of the blower holes 44, each of the rod-like electrodes 32a is disposed at an intermediate position between the blower holes 44.

To both ends of the positive electrode panel 32, a tube 52 is connected via a connector 51. The tube 52 is connected to the temperature controller 19. The temperature controller 19 sends cooling water as the heating medium from outside of the vacuum tank 15 to the electrode panel 32 via the tube 52. Thereby, the positive electrode panel 32 is cooled.

Figure 7:
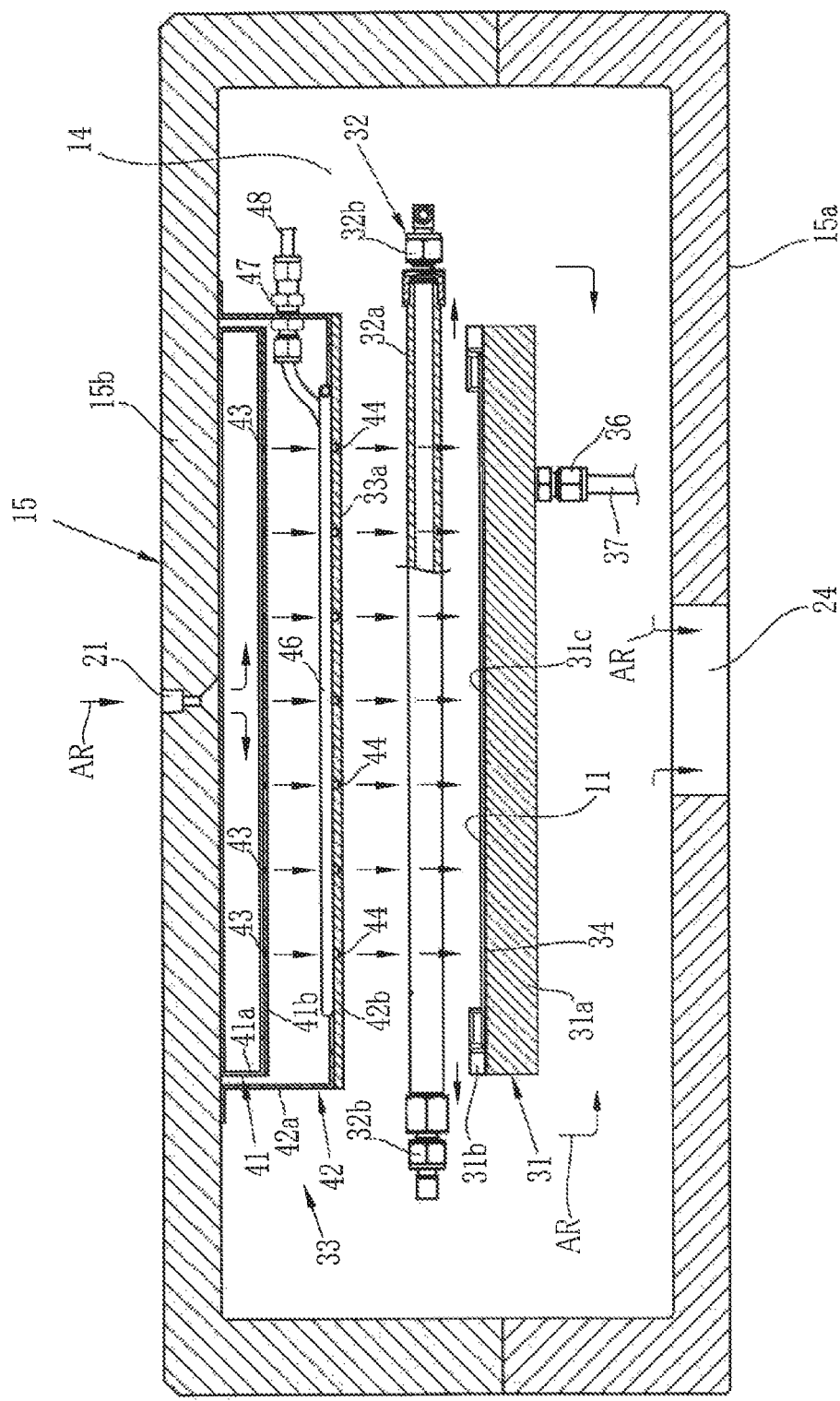
FIG. 7 is a cross sectional view taken along line VII-VII of FIG. 2.
Figure 8:
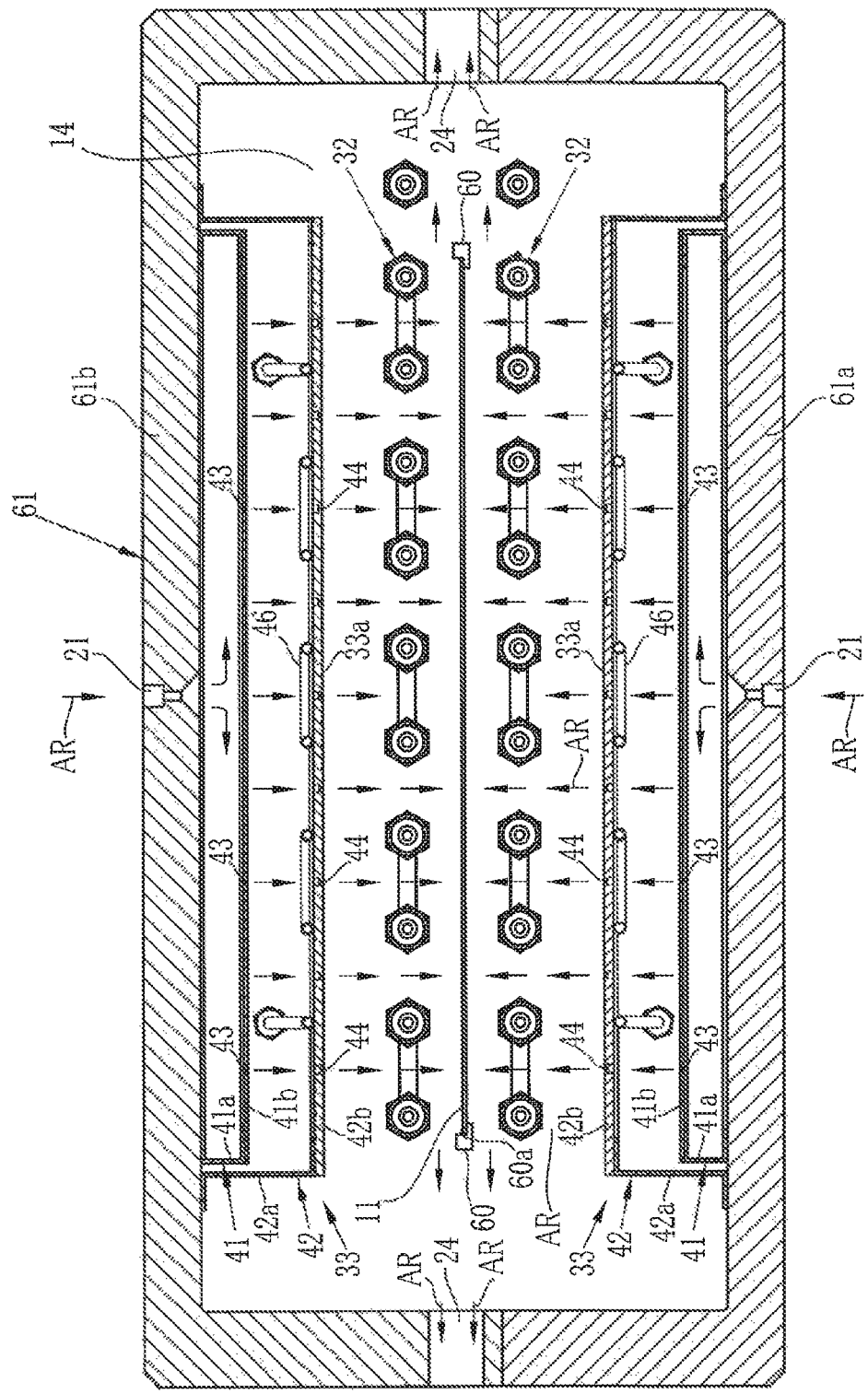
FIG. 8 is a longitudinal sectional view showing a vacuum tank of the second embodiment in which both surfaces of a substrate are subjected to plasma treatment.

As shown in FIG. 7, the electrode panel 32 is held in the lid 15b by a bracket (not shown). An insulating member (not shown) is disposed between the electrode panel 32 and the bracket and tube. The insulating member insulates the bracket and the lid from the electrode panel. As shown in FIG. 2, the positive electrode panel 32 is connected to the positive pole of the high-frequency power source 18 via a power line (not shown). Also, the vacuum tank 15 is connected to the negative pole of the high-frequency power source 18.

The high-frequency power source 18 outputs high-frequency voltage as plasma generation voltage for generating plasma. The frequency of the high-frequency voltage outputted from the high-frequency power source 18 is in the range of 40 kHz to several hundred kHz, for example. Note that the frequency of the high-frequency voltage is not limited to the above-described range, and may be arbitrarily set in accordance with the content of the plasma treatment and the like. For example, the frequency of the high-frequency voltage may be higher or lower than the above-described range.

Next, the operation of the above-described configuration will be explained hereinbelow. The plasma treatment is performed upon actuation of each component under the control of the control unit 13. First, as shown by two-dot chain lines in FIG. 1, the lid 15b is moved to the opened position. Next, the substrate 11 to be processed is inserted into the substrate holder 31, and then the lid 15b is returned to the closed position. Note that opening and closing of the treatment chamber 14 and carrying out/loading of the substrate 11 are automatically performed by a robot hand or another transfer device, but those operations may be performed manually. Thereby, the step of holding the substrate 11 in the substrate holder 31 is performed.

Upon actuation of the vacuum pump 16, air is exhausted from the treatment chamber 14 until a predetermined degree of vacuum is achieved. When the predetermined degree of vacuum is achieved, the supply of the process gas by the gas feeder 17 is started, and the application of the high-frequency voltage to the positive electrode panel 32 by the high-frequency power source 18 is also started. The process gas is introduced into the blower panel 33 from the introduction port 21. First, the air gas regulating plate 41b of the inner panel 41 delivers the process gas uniformly to the blower holes 44 of the outer panel 42. And the process gas blows out uniformly from the blower holes 44.

By application of the high frequency voltage to the positive electrode panel 32, an electric field is generated between the positive electrode panel 32 and the blower surface 33a of the blower panel 33 to be the ground electrode. In this electric field, the process gas is excited and turned into plasma. Then, radicals and ions contained in the generated plasma are supplied to the substrate 11, thereby contaminated substances adhered to the surface of the substrate 11 are removed. In this way, cleaning of the substrate 11, which is the plasma treatment step, is carried out. The process gas after cleaning flows out from between the positive electrode panel 32 and the substrate 11 and is discharged from the exhaust port 24 on the lower surface of the substrate holder 31.

Since the blower surface 33a of the blower panel 33, the positive electrode panel 32, and the substrate 11 held in the substrate holder 31 are arranged in parallel, the process gas is efficiently plasmatized between the blower panel 33 which is the negative electrode, and the positive electrode panel 32. Moreover, the plasma region is uniform over the entire surface between the blower panel 33 and the positive electrode panel 32. Accordingly, the plasma (i.e. radicals and ions) is supplied from the plasma region uniformly and sufficiently to each part of the upper surface of the substrate 11. Therefore, the upper surface of the substrate 11 is uniformly cleaned by the plasma. Further, since the substrate 11 is cleaned with sufficient amount of plasma, the plasma treatment is completed in a short time. Since the plasma treatment is completed in a short time, the substrate 11 is hardly affected by heat generated in the electrode panel 32. In addition, since the plasma that has passed through the positive electrode panel contacts the substrate 11, unlike the case where the substrate 11 is disposed in the plasma region, the damage of the substrate 11 due to electric discharge can be also suppressed.

Upon completion of the plasma treatment to the substrate 11 after a certain period of time, the supply of the process gas, the exhaust of air, and application of the high-frequency voltage are stopped. Then, after the pressure inside the treatment chamber 14 returns to the atmospheric pressure, the lid 15b is moved to the opened position, to open the treatment chamber 14. Then, the substrate 11 subjected to the plasma cleaning is taken out from the treatment chamber 14. Thereafter, by repeating the same steps, the substrates 11 can be successively cleaned.

In the above embodiment, the substrate 11 is described as the workpiece. However, the workpiece is not limited to the substrate 11, but also may be a lead frame, a plate-like workpiece and a three-dimensional workpiece, such as an object having an uneven surface and a substrate or the like having a surface on which semiconductor chips are mounted. Also, the plasma cleaning (cleaning) of the substrate 11 was explained. However, examples of the plasma treatment may include cleaning of electrodes of the semiconductor chips mounted on the surface of the substrate or the like, resist etching, descumming, desmearing, surface modification, and the like.

Second Embodiment

In the first embodiment, one surface (the front surface) of the substrate 11 is subjected to the plasma treatment. However, in the second embodiment shown in FIG. 8, both the surfaces (the front and back surfaces) of the substrate 11 are subjected to the plasma treatment. In the second embodiment, a substrate holder 60 is provided with a substrate mounting surface 60a corresponding to only the outer peripheral edge of the substrate 11. Accordingly, with the front and back surfaces of the substrate 11 exposed, the substrate 11 is held horizontally on the substrate mounting surface 60a. Note that instead of or in addition to the substrate mounting surface 60a on which the outer peripheral edge portion of the substrate 11 is mounted, a clamping device for clamping a part of the outer peripheral edge portion of the substrate 11 may be provided.

A vacuum tank 61 consists of a vacuum tank main body 61a and a lid 61b. In the lid 61b, the blower panel 33 and the electrode panel 32 having the same configuration as in the first embodiment are provided. In addition, in the vacuum tank main body 61a, the blower panel 33 and the electrode panel 32 having the same configuration as in the lid 15b of the first embodiment are provided. Furthermore, the exhaust port 24 serving also as the air release hole and an evacuation hole (not shown) are formed on both sides of the lid 61b. Note that instead of forming the exhaust port 24 and the evacuation hole on both sides of the lid 61b, the exhaust port 24 and the evacuation hole may be formed in the vacuum tank main body 61a.

With the blower panel 33 and the electrode panel 32 of the vacuum tank main body 61a and the lid 61b, both surfaces of the substrate 11 held by the substrate holder 60 are cleaned by plasma in the same manner as in the first embodiment (the double-face plasma treatment step). Note that the same reference numerals are given to the same members as those of the first embodiment, and redundant explanations are omitted.

In the above embodiments, the vacuum tank 15 has a thin box shape to be divided into two parts in a vertical direction, but it may be divided into two parts, left and right or front and rear. Also, the lid only has to be opened and closed with respect to the vacuum tank main body, so the lid may be opened and closed by a hinge.

Although the present invention has been fully described by the way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A plasma treatment apparatus, comprising:
a workpiece holder for holding a workpiece;
a vacuum tank for containing the workpiece holder, an interior of the vacuum tank configured to be evacuated;
a plate-like blower panel to be a negative electrode, the blower panel having a plurality of blower holes for sending a process gas toward the workpiece held by the workpiece holder; and
a positive electrode panel disposed between the blower panel and the workpiece holder, the positive electrode panel being constituted by arranging in series a plurality of rod-like electrodes parallel to a surface to be treated of the workpiece,
wherein the workpiece has a plate shape, and a surface of the blower panel to be the negative electrode, the positive electrode panel, and the workpiece held on the workpiece holder are arranged in parallel,
wherein a distance between the plate-like blower panel and the positive electrode panel is 50 mm and a distance between the workpiece and the positive electrode panel is 25 mm,
wherein the vacuum tank includes an introduction port and an exhaust port of the process gas, the introduction port and the exhaust port configured to respectively introduce and exhaust the process gas in a direction perpendicular to the surface to be treated of the workpiece,
wherein the plurality of rod-like electrodes includes:
a first electrode;
a second electrode located adjacent to the first electrode, an end of the second electrode being connected to the first electrode to circulate a coolant from the first electrode to the second electrode; and
a third electrode located adjacent to the second electrode, another end of the second electrode being connected to the third electrode to circulate the coolant from the second electrode to the third electrode,
wherein an entirety of the rod-like electrodes extending inside the vacuum tank is directly exposed to the workpiece and the surface of the blower panel, and
wherein the plasma is configured to be generated between the positive electrode panel and the blower panel.

2. The plasma treatment apparatus according to claim 1, wherein the blower holes open toward between the rod-like electrodes of the positive electrode panel and are arranged in a matrix.

3. The plasma treatment apparatus according to claim 2, wherein the blower panel includes an air regulating plate placed inside the blower panel, and the air regulating plate has a plurality of air regulating holes.

4. The plasma treatment apparatus according to claim 3, wherein the vacuum tank is configured to move between a separated state in which a first tank and a second tank are separated and a connected state in which the first tank and the second tank are combined to enable evacuating, and in a case where the vacuum tank is in the separated state, the workpiece is carried in and out of the workpiece holder.

5. The plasma treatment apparatus according to claim 4, wherein the first tank includes the workpiece holder,
wherein the second tank includes the blower panel and the positive electrode panel,
wherein at least one of the first tank and the second tank has an air release hole, and
wherein the exhaust port of the process gas further serves as the air release hole.

6. The plasma treatment apparatus according to claim 4, wherein the second tank includes the blower panel and the electrode panel, and
wherein the first tank or the second tank includes the workpiece holder, and one of the exhaust port of the process gas and an air release hole.

7. The plasma treatment apparatus according to claim 1, wherein the blower panel and the workpiece holder include a passage in which a heating medium is circulated.

8. The plasma treatment apparatus according to claim 1, wherein the blower panel further includes an air regulating plate including a plurality of air regulating holes to pass the process gas, inside the vacuum tank, a bottom surface of the air regulating plate being exposed to an upper surface of a nozzle plate of the blower panel, and
wherein the plurality of air regulating holes align with the plurality of blower holes.

9. The plasma treatment apparatus according to claim 8, wherein the nozzle plate extends parallel to the air regulating plate.

10. The plasma treatment apparatus according to claim 8, wherein the blower panel further includes a frame for holding the nozzle plate and the air regulating plate on opposite sides of the frame.

11. The plasma treatment apparatus according to claim 10, wherein the frame, holding the nozzle plate and the air regulating plate, is placed between the positive electrode panel and a surface of the vacuum tank.

12. The plasma treatment apparatus according to claim 8, wherein, in a stacking direction of the air regulating plate on the nozzle plate, the plurality of air regulating holes align with the plurality of blower holes to pass the process gas.

13. The plasma treatment apparatus according to claim 8, wherein the bottom surface of the air regulating plate directly faces the upper surface of the nozzle plate.

14. The plasma treatment apparatus according to claim 8, wherein, in a plan view, the plurality of air regulating holes overlap with the plurality of blower holes to pass the process gas uniformly throughout the blower panel.

15. The plasma treatment apparatus according to claim 8, wherein an entirety of the air regulating plate is located inside the vacuum tank.

16. The plasma treatment apparatus according to claim 15, wherein an entirety of the nozzle plate is located inside the vacuum tank.

17. The plasma treatment apparatus according to claim 1, wherein upper surfaces of the first electrode, the second electrode, and the third electrode are directly exposed to a bottom surface of the blower panel, and
wherein bottom surfaces of the first electrode, the second electrode, and the third electrode are directly exposed to the surface to be treated of the workpiece.

18. The plasma treatment apparatus according to claim 1, wherein the blower panel includes:
- a nozzle plate that includes the blower holes, a bottom surface of the nozzle plate being directly exposed to the plurality of rod-like electrodes; and
- a cooling pipe extending between the blower holes to cool the blower panel and being disposed on an upper surface of the nozzle plate that faces away from the positive electrode panel.

* * * * *